Dec. 25, 1962 A. E. PLOGSTEDT ET AL 3,070,757
STABLE TRANSISTOR R-C OSCILLATOR
Filed March 16, 1960

INVENTORS.
ALLEN E. PLOGSTEDT.
RICHARD W. BRADMILLER
BY Alden D. Redfield
Irwin P. Garfinkle
ATTORNEYS.

United States Patent Office 3,070,757

Patented Dec. 25, 1962

3,070,757

STABLE TRANSISTOR R-C OSCILLATOR

Allen E. Plogstedt, Cincinnati, Ohio, and Richard W. Bradmiller, Winter Park, Fla., assignors to Avco Corporation, Cincinnati, Ohio, a corporation of Delaware Filed Mar. 16, 1960, Ser. No. 15,346

2 Claims. (Cl. 331—110)

This invention relates to transistorized oscillators and, more particularly, to low frequency, resistance-capacitance type oscillators capable of extremely stable operation.

The present use of low frequencies in many communication and command intelligence systems requires high stability, low frequency generating equipment. At the required low frequencies (under 1,000 cycles), crystal-controlled oscillators are large, awkward to incorporate, and difficult to maintain. This invention obtains the required stability without the use of crystals, but instead uses simple direct current circuitry with A.-C. and D.-C. feedback loops so incorporated that stable frequency operation results automatically.

The primary object of this invention is to provide a low frequency, transistorized oscillator having high frequency stability without the use of crystals.

Another object of this invention is the provision of a low frequency generator having unique self-stabilizing circuitry permitting the use small, inexpensive commercial components.

Still another object of this invention is to provide a two-transistor oscillator wherein the load of one transistor comprises a reactive network which functions as a tuned circuit in conjunction with a diode of the other transistor, the reactive network exhibiting negative impedance characteristics.

For further objects and for a better understanding of the precise nature of this invention, reference should now be made to the following detailed specification and to the accompanying drawing, in which.

Figure 1:
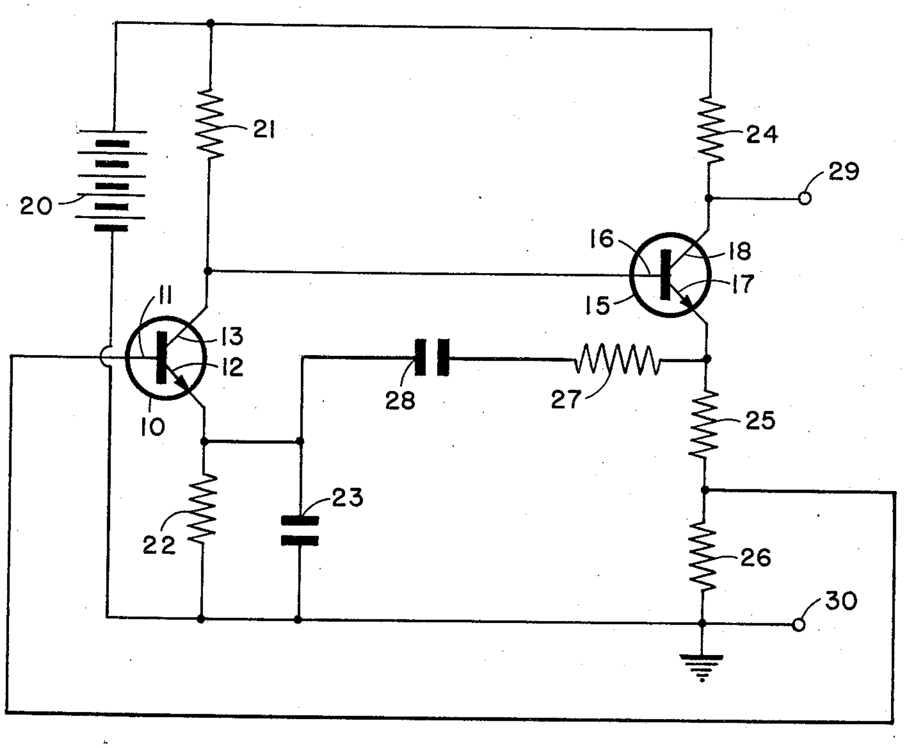
FIG. 1 is a circuit diagram of a preferred embodiment of this invention.

Referring now to FIG. 1, the preferred form of stable oscillator is illustrated as comprising a transistor 10 having a base 11, an emitter 12, and a collector 13, and a transistor 15 having a base 16, an emitter 17, and a collector 18. Collector-emitter bias for the transistor 10 is provided by means of a battery 20 connected to the collector 13 through a bias resistor 21 and to the emitter 12 through an emitter-resistor 22, which is bypassed for A.-C. by a condenser 23. Similarly, collector-emitter bias for the transistor 15 is provided by means of the battery 20 connected to the collector 18 through bias resistor 24 and to the emitter 17 through emitter-resistors 25 and 26.

Base bias for the transistor 15 is provided by means of a direct connection from the junction of the collector 13 of transistor 10 and the bias resistor 21 to the base 16. Base bias for the transistor 10 is provided by means of a feedback connection from the junction of emitter-resistors 25 and 26 to the base 11. For the purpose of producing sustained oscillations in the output of transistor 15, a reactive network is provided between the emitter 17 and the emitter 12 by means of a connection through resistor 27 and condenser 28. This reactance network includes the emitter-resistor 22 and the bypass condenser 23, emitter-resistors 25 and 26, the resistor 27, and the condenser 28. The oscillating output is derived from between the collector 18 and ground at output terminals 29 and 30.

In setting up the illustrated apparatus for stable frequency operation, the connection from the emitter 17 to the emitter 12 through the resistor 27 and the condenser 28 is broken and the values of the resistors 22, 25, and 26 are selected for stable direct current operation. The emitter-resistor 26, in parallel with the series combination of resistor 25 and the reflected emitter impedance of transistor 15 with respect to ground, constitutes a base-driving impedance for the transistor 10. By maintaining the base-driving impedance low, compared to the base input impedance of transistor 10, stable direct current operation results over a wide variation in transistor parameters. Upon completing the connection from the emitter 17 to the emitter 12 through the resistor 27 and the condenser 28, the apparatus goes into oscillations at a frequency determined by the values of the various resistors and condensers in the reactive network, and a stable low frequency output may be derived at output terminals 29 and 30.

In operation, when the battery 20 is first connected across the transistors 10 and 15, transistor 10 will not conduct until a bias has been established at the base 11. On the other hand, base 16 of transistor 15 is provided with a very high operating bias by means of the voltage developed across resistor 21. Therefore, heavy currents immediately flow through the resistor 24, the collector-emitter junction of transistor 15, and through the resistors 25 and 26. The voltage pulse developed across the resistor 26 is fed directly to the base 11 of transistor 10, biasing this transistor into conduction. When the transistor 10 conducts, the voltage at collector 13 decreases, thereby reducing the base bias on transistor 15 and cutting it off. Cutting off conduction of transistor 15 reduces the bias applied to the base 11, thereby cutting off the transistor 14. The cycle then repeats.

The resultant short periods of conduction, first through the transistor 15 and then through the transistor 10, alternately produce large voltage drops across the resistors 25 and 26 and across the resistor 22. Since these voltage drops are produced 180 degrees out of phase, the reactance network between the emitters 12 and 17 is driven first in one direction and then in the opposite direction to produce oscillations in the emitter-base junction of transistor 15 and across the output terminals 29 and 30 of transistor 15.

These oscillations are extremely stable in frequency, due to the unique nature of the circuitry. Note that the reactive circuit resistors 22, 25, 26, and 27 and capacitors 23, 28 will be driven from emitter 12 of transistor 10 for a short duration, and then the reactive circuit will ring as in a class C amplifier; when the circuit has rung 180 degrees, the drive required to keep the circuit in oscillation will be introduced into the circuit from the emitter 17 of transistor 15. With the correct components and adequate drive from emitters 12 and 17, the circuit will oscillate at the desired frequency. The circuit will have high stability because of the low driving impedance from emitters 12 and 17 into the relatively high impedance of the reactive circuit composed of resistors 22, 25, 26, 27 and capacitors 23, 28.

In effect, the disclosed circuit simulates an inductance-capacitance-resistance network to control the frequency of operation of transistor 15. Transistor 10 functions simultaneously as a stabilized negative resistance driver and as an inductive reactant multiplier. This may be observed by reference to FIG. 2 in which the circuit equivalent of FIG. 1 is illustrated.

Figure 2:
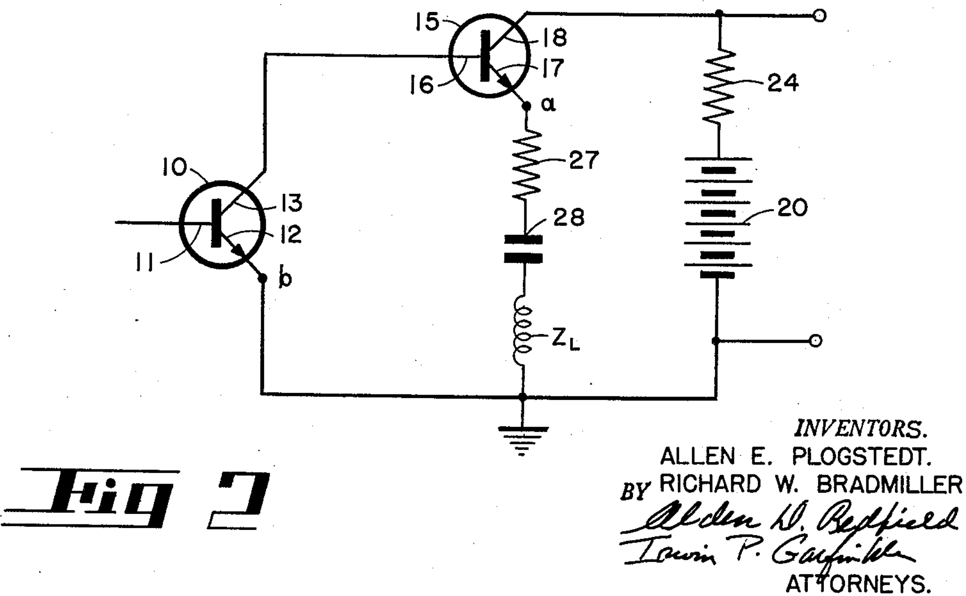
FIG. 2 is an equivalent circuit diagram demonstrating the nature and operation of FIG. 1.

For an analysis of FIG. 2, it is seen that the reactive network includes resistor 27, condenser 28, and the equivalent inductive impedance $Z_L$ which represents the parallel combination of condenser 23, resistor 22, and the inductance of the base-emitter-diode junction of transistor 10. This reactive network is connected in the input of transistor 10 and is driven by the output of both transistors 10 and 15 from two terminals *a* and *b*, 180 degrees out of phase.

While this invention is not limited to any particular circuit parameters, the following were incorporated in an oscillator designed for operation at 900 cycles per second and actually reduced to practice and extensively tested:

| | | |
|---|---|---|
| Resistors: | | |
| **21** | ohms | 12K |
| **22** | do | 2.2K |
| **24** | do | 4.7K |
| **25** | do | 4.7K |
| **26** | do | 2.5K |
| **27** | do | 2.2K |
| Condensers: | | |
| **23** | μf | .01 |
| **28** | μf | .05 |
| Transistors: | | |
| **10** | | Type 903(TI) |
| **15** | | Type 903(TI) |

Thus, it will be recognized that this invention has provided a highly stable and efficient low frequency generator having utility in many electronic networks. While eliminating the low frequency crystal formerly required, this circuit enables the use of commercial components having wide tolerances and, in addition, has enabled a vast reduction in size with known oscillators having comparable stability.

What is claimed is:

1. In combination, an oscillator for generating a low frequency sine wave comprising: first and second amplifiers; each including an electron flow-path device having electron-emitting, electron flow-controlling, and electron-collecting electrodes; a two-terminal source of direct currents; a first resistor connected between one terminal and the current-collecting electrode of said first device; a second resistor connected between the current-emitting electrode of said first device and the other terminal of said source; a third resistor connected between one terminal of said source and the current-collecting electrode of said second device; a fourth resistor connected between the current-emitting electrode of said second device and the other terminal of said source, said source being poled to reversely bias said current-collecting electrodes and to forwardly bias said current-emitting electrodes; a direct connection from the junction of said first resistor and said current-collecting electrode of said first device for forwardly biasing the current-controlling electrode of said second device; a direct current connection from said fourth resistor to the current-controlling electrode of said first device for forwardly biasing said electrode whereby stabilized direct current amplification results; and a regenerative connection between the current-emitting electrodes of said first and second devices, said connection including a fifth resistor and a first condenser in series between said current-emitting electrodes, and a second condenser connected to said first condenser and in parallel with said second resistor whereby oscillation results in a series loop including the current-emitting and current-collecting electrodes of said first device, the current-controlling and current-emitting electrodes of said second device, and said regenerative connection.

2. The invention as defined in claim 1 wherein each said device is a transistor.

References Cited in the file of this patent

UNITED STATES PATENTS

| | | |
|---|---|---|
| 2,303,862 | Peterson | Dec. 1, 1942 |
| 2,623,945 | Wigan | Dec. 30, 1952 |
| 2,761,970 | Owens | Sept. 4, 1956 |

FOREIGN PATENTS

| | | |
|---|---|---|
| 1,092,410 | France | Apr. 21, 1955 |
| 787,917 | Great Britain | Dec. 18, 1957 |

OTHER REFERENCES

Mayo et al.: Electronic and Radio Engineer, November 1958, pages 412 to 416.

UNITED STATES PATENT OFFICE

CERTIFICATE OF CORRECTION

Patent No. 3,070,757 December 25, 1962

Allen E. Plogstedt et al.

It is hereby certified that error appears in the above numbered patent requiring correction and that the said Letters Patent should read as corrected below.

Column 1, line 28, after "use" insert -- of --; column 2, line 35, for "14" read -- 10 --; line 65, for "reactant" read -- reactance --; column 3, lines 36 and 37, for "amplifiers;" read -- amplifiers, --.

Signed and sealed this 25th day of June 1963.

(SEAL)
Attest:

ERNEST W. SWIDER
Attesting Officer

DAVID L. LADD
Commissioner of Patents